United States Patent [19]

Tice

[11] Patent Number: 4,940,980
[45] Date of Patent: Jul. 10, 1990

[54] INPUT STAGE FOR FLASH A/D CONVERTER

[75] Inventor: Thomas E. Tice, Greensboro, N.C.

[73] Assignee: Analog Devices, Inc., Norwood, Mass.

[21] Appl. No.: 348,050

[22] Filed: May 5, 1989

[51] Int. Cl.$^5$ .......................... H03M 1/36; H03M 1/06
[52] U.S. Cl. ........................................ 341/159; 341/118
[58] Field of Search ......................... 341/159, 118, 155

[56] References Cited

U.S. PATENT DOCUMENTS 4,752,766  6/1988  Shimizu et al. ...................... 341/159
4,851,845  7/1989  Hotta et al. .......................... 341/159
4,885,548  12/1989 Wakimoto et al. .................. 341/159

Primary Examiner—William M. Shoop, Jr.
Assistant Examiner—Sharon D. Logan
Attorney, Agent, or Firm—Wolf, Greenfield & Sacks

[57] ABSTRACT

A flash converter in which an input circuit is provided for maintaining a substantially constant collector-base voltage on the input emitter-followers, so as to obviate the distortion caused by variation of the input capacitance with input voltage. The driving source directly drives the base of the emitter-followers and, through a level-shift circuit, also drives the collectors of the emitter-follower transistors.

5 Claims, 2 Drawing Sheets

INPUT STAGE FOR FLASH A/D CONVERTER

FIELD OF THE INVENTION

This invention relates to the field of analog to-digital converters (ADC's) and, particularly, to an input stage for a flash, or parallel, analog-to-digital converter, which improves harmonic distortion performance.

BACKGROUND OF THE INVENTION

One of the most popular types of analog-to-digital converters for high-speed use is the parallel, or flash, converter. A good reference for general background information on flash converters is D. H. Sheingold, (ed.), The Engineering Staff of Analog Devices, Inc., *Analog-Digital Conversion Handbook* (3rd ed.), Prentiss-Hall, Englewood Cliffs, N.J., at pp. 420–427, which is incorporated by reference herein. In general, the input node of a flash ADC is connected in parallel to the inputs of a large number of emitter-followers, each of which drives a comparator. The number of emitter-followers, N, is $2^n - 1$, where n is the number of bits in the digital output.

The dynamic performance of flash converters is usually limited by harmonic distortion at high frequencies. This harmonic distortion is largely attributable to the fact that the parallel emitter followers present a substantial non-linear, voltage-dependent capacitance at the input node, which is driven by a source having a non-zero output impedance. Referring to FIG. 1, a typical input stage $10_i$ is shown (where i varies from 0 to $2^n - 1$). Of course, there are $2^n - 1$ such stages connected in parallel at input node 12. The input stage $10_i$ comprises a first emitter-follower transistor 14 driven by the input signal; a second emitter-follower transistor 16 which senses a voltage on a resistive ladder 18; and a comparator formed of a differential amplifier pair 22A, 22B. The transistors are biased by current sources 24, 26, and 28. The collectors of transistors 14 and 16 are connected at node 36 ground or a fixed voltage source. Node 12 is assumed to be driven by a source 32, having an output impedance 34 of value $R_o$. The input impedance of the converter, at node 12, includes a large capacitive component attributable largely to the collector junction capacitances (Cbc's) of the input emitter-follower transistors 14. This junction capacitance is non-linear and voltage-dependent. An error voltage is therefore created at the input, as the current for charging and discharging the input capacitance flows through the driving source impedance 34.

An obvious solution to this problem is to use an amplifier or buffer of very low output impedance to drive the flash converter. This solution is not effective, however, for very high-speed, high-resolution (i.e., more than about 6 bits) converters. First, there is a lack of commercially available amplifiers or buffers with distortion levels low enough to prevent the amplifier from limiting the system performance. Secondly, due to the capacitive input of the converter, a series resistance generally must be placed between the driving source (including such an amplifier) and the converter, in order to maintain stability. This series resistance results in exactly the problem described above.

Another approach is to bias the emitter-follower transistors to a voltage more positive than that required for the input range, so as to operate the transistors in a range where the voltage dependency of the input capacitance is reduced. This approach does result in a reduction of harmonic distortion caused by junction capacitance changes, but it does not eliminate such distortion.

Accordingly, it is an object of the present invention to provide an input circuit for a flash analog-to-digital converter which substantially eliminates harmonic distortion at high input frequencies.

SUMMARY OF THE INVENTION

The foregoing and other objects and advantages of the present invention are achieved in a flash converter in which means are provided for maintaining a substantially constant collector-base voltage on the input emitter-followers, so as to obviate the distortion caused by variation of the input capacitance with input voltage. The driving source directly drives the base of the emitter-followers and, through a level-shift circuit, also drives the collectors of the emitter-follower transistors.

The invention, its objects and advantages, will be more fully understood from the detailed description below, which should be read in conjunction with the accompanying drawing.

DETAILED DESCRIPTION

Figure 1:
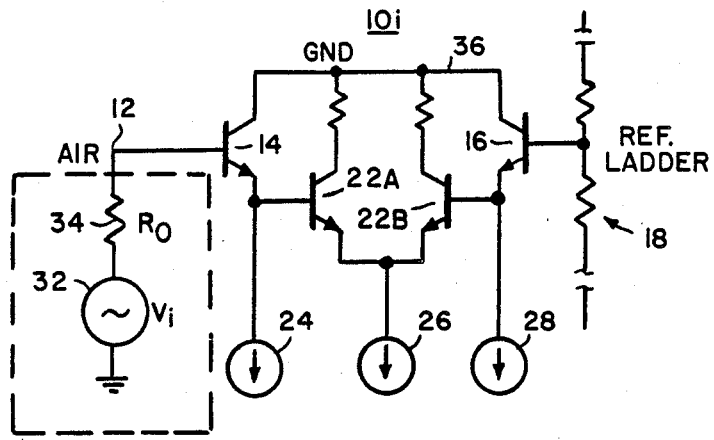
FIG. 1 is a simplified circuit diagram of a typical input stage and comparator for a flash converter, according to the prior art.
Figure 2:
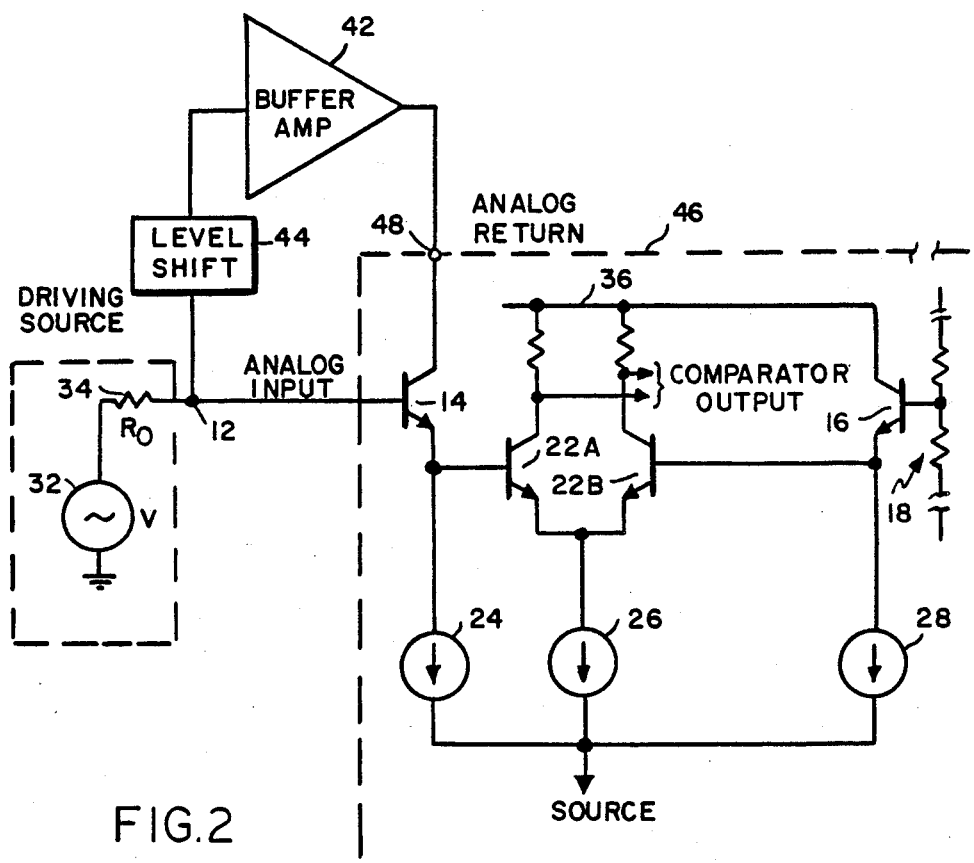
FIG. 2 is a simplified schematic circuit diagram for a first embodiment of a flash converter input stage, according to the present invention.

The present invention is shown in partially schematic, partially block diagram form in FIG. 2. In contrast to FIG. 1, the collector of the input emitter-follower transistor 14 is not connected to ground or supply node 36 but, rather, is driven by a buffer amplifier 42 which, in turn, is driven by the output of a level-shifting circuit 44. The input of level-shifting circuit 44 is connected to input node 12. The output of level-shifting circuit 44 is the instantaneous voltage at node 12, plus a constant offset value. Buffer 42 provides unity gain, so the voltage on the collector of transistor 14 is the same voltage as appears at the output of level shifter 44. Buffer amplifier 42, however, has a low impedance output which can supply the collector current needed by transistor 14. This arrangement maintains a substantially constant collector-base voltage on transistor 14. With an ideal buffer, this configuration theoretically eliminates all harmonic distortion due to the collector-base capacitance and driving impedance $R_o$. Ideal distortionless buffers do not exist, of course. However, the distortion requirements of the buffer are much reduced from those of the analog input and can be easily implemented with available components to yield a system that is no longer limited by harmonic distortions created by the Cbc–$R_o$ combination. Moreover, this circuit significantly reduces the capacitive load seen by the driving source, making node 12 easier to drive.

For reasons relating to manufacturing concerns, the level shifter 44 and buffer amplifier 42 may not be provided on the same integrated circuit substrate as the input transistors 14 and other components of the flash converter, per se. Thus, it is contemplated that a commercial product adapted to produce the combination of FIG. 2 may, in fact, be packaged as indicated by dashed line 46, with everything inside line 46 being on a single chip and the collectors of transistors 14 being brought out to a pin or terminal 48, so as to allow external connection of level shifter 44 and buffer amplifier 42.

Figure 3:
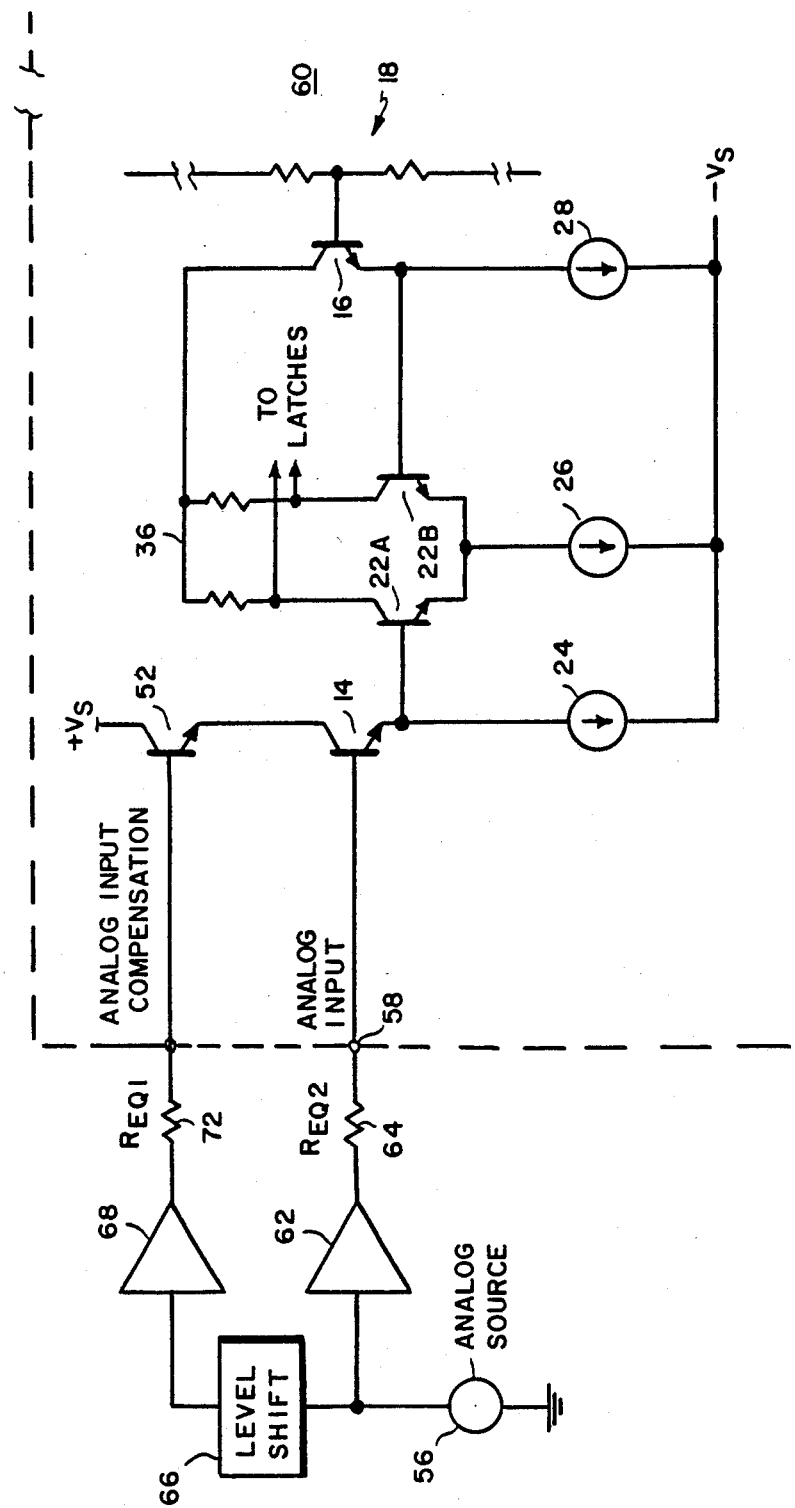
FIG. 3 is a simplified schematic circuit diagram for a second embodiment of a flash converter input stage, according to the present invention.

An alternative embodiment of the invention is shown in FIG. 3. There, the collector of emitter follower transistor 14 is connected to the emitter of a cascode transistor 52. The collector of transistor 52 is connected to a voltage source, $+V_s$, which is substantially more positive than the voltage on the bases of transistor 52. The base of transistor 52 is connected to a pin, or terminal, 54, which is labelled ANALOG INPUT COMPENSATION; the bases of all of the cascode transistors of the various $2^n-1$ stages are connected in parallel to this pin. An analog signal source 56 drives the ANALOG INPUT pin 58 of the chip 60 through a first buffer 62 and first resistor 64 of resistance $R_{EQ2}$. The source 56 also drives the ANALOG INPUT COMPENSATION pin 54 through a level shift circuit 66, second buffer 68 and second resistor 72 of resistance $R_{EQ1}$.

By connecting the collectors of the cascode transistors to a source which is significantly more positive than the bases, collector-base capacitance is minimized in these devices. Harmonic distortion is produced due to the charging and discharging of the collector-base capacitance of transistor 52 through resistance $R_{EQ1}$. This distortion will appear at the emitter of transistor 52, which is a high impedance node. There will be little or no distortion introduced to the emitter of transistor 14, which is the actual signal node of interest.

One advantage of this embodiment is that the buffer 68, in contrast to buffer 42 of FIG. 2, need not supply current for $2^n-1$ emitter-followers. An additional advantage is that the input impedance of pin 54 is more closely matched to the input impedance at pin 58 than is the input impedance at pin 48 (FIG. 2). This allows the use of two identical buffers driving essentially the same impedance, minimizing any phase or propagation delay differences between the two input paths. This is important because a substantial phase difference between the two analog input paths of either embodiment can raise the harmonic distortion level that otherwise would be produced, as well as introducing instability.

Having thus described the invention, various alterations, modifications and improvements thereto will readily occur to those skilled in the art, including other packaging alternatives. Therefore, it will be understood that the foregoing description is intended by way of example only and is not intended to be limiting. The invention is limited only as defined in the following claims and equivalents thereto.

What is claimed is:

1. In a flash analog-to-digital converter having an input node, or terminal, for receiving an analog input voltage and a plurality of emitter-follower transistors, each emitter-follower transistor having a base electrode connected to said input terminal and an emitter electrode connected to a comparator circuit, the improvement comprising:
   each of said emitter-follower transistors having a collector electrode connected to a terminal for connection to a means for providing thereto a voltage offset by a constant amount from the analog input voltage.

2. A flash analog to-digital converter comprising:
   a. a plurality of input stages connected in parallel to an input node for receiving an analog input voltage;
   b. a like plurality of comparator stages, each input stage driving a corresponding one of the comparator stages;
   c. each input stage comprising an emitter-follower transistor having a base electrode connected to the input node and an emitter electrode connected to drive the corresponding comparator stage;
   d. offset means connected to the input node to supply a voltage offset from the analog input voltage by a constant value; and
   e. said offset means being connected to drive in parallel the collector electrodes of said emitter-follower transistors.

3. The converter of claim 2, wherein the offset means comprises a level-shifting circuit having an input connected to the input node and an output connected to drive the input of a buffer amplifier, the buffer amplifier having an output driving in parallel the collectors of the emitter-follower transistors.

4. A flash analog-to-digital converter comprising:
   a. a plurality of input stages connected in parallel to an input node for receiving an analog input voltage;
   b. means for supplying the analog input voltage, including an analog signal source, a first buffer amplifier connected to receive the output of the analog signal source, and a first resistance connected between the output of the buffer amplifier and the input node;
   c. a like plurality of comparator stages, each input stage driving a corresponding one of the comparator stages;
   d. each input stage comprising an emitter-follower transistor having a base electrode connected to the input node and an emitter electrode connected to drive the corresponding comparator stage;
   e. offset means connected to the analog source to supply a voltage offset from the output of the analog source by a constant value; and
   f. said offset means being connected operatively to drive the collector electrodes of said emitter-follower transistors.

5. The converter of claim 4 further including a cascode transistor for each emitter-follower transistor, the emitter electrode of the cascode transistor being connected to the collector electrode of a respective one of the emitter-follower transistors, the collector electrode of the cascode transistor being connected to a supply voltage substantially greater than the voltage at the base of the cascode transistor, and the the offset means including a level shift circuit connected to receive the output of the analog source, a second buffer connected to receive the output of the level shift circuit, and a second resistor connected between the output of the second buffer and the base of the cascode transistor.

* * * * *